(12) United States Patent
Kim

(10) Patent No.: US 9,001,547 B2
(45) Date of Patent: Apr. 7, 2015

(54) SEMICONDUCTOR APPARATUS, TEST METHOD USING THE SAME AND MUTI CHIPS SYSTEM

(71) Applicant: SK Hynix Inc., Icheon-si Gyeonggi-do (KR)

(72) Inventor: Dae Suk Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 123 days.

(21) Appl. No.: 13/846,864

(22) Filed: Mar. 18, 2013

(65) Prior Publication Data

US 2014/0177365 A1 Jun. 26, 2014

(30) Foreign Application Priority Data

Dec. 20, 2012 (KR) .................. 10-2012-0149910

(51) Int. Cl.
| | |
|---|---|
| G11C 5/00 | (2006.01) |
| G11C 29/00 | (2006.01) |
| H01L 23/498 | (2006.01) |
| G11C 29/26 | (2006.01) |
| G11C 29/40 | (2006.01) |
| H01L 23/48 | (2006.01) |

(52) U.S. Cl.
CPC ... *H01L 23/49827* (2013.01); *H01L 2924/0002* (2013.01); *H01L 2225/06541* (2013.01); *G11C 29/26* (2013.01); *G11C 29/40* (2013.01); *H01L 23/481* (2013.01)

(58) Field of Classification Search
USPC ...................................... 365/52, 201
See application file for complete search history.

(56) References Cited

U.S. PATENT DOCUMENTS

| | | | | |
|---|---|---|---|---|
| 8,593,891 | B2 * | 11/2013 | Nishioka ........................ | 365/201 |
| 8,618,541 | B2 * | 12/2013 | Yang et al. .................... | 365/201 |
| 8,717,839 | B2 * | 5/2014 | Yokou et al. .................. | 365/201 |

FOREIGN PATENT DOCUMENTS

| | | |
|---|---|---|
| KR | 1020100133192 A | 12/2010 |
| KR | 1020120082636 A | 7/2012 |

* cited by examiner

*Primary Examiner* — Trong Phan
(74) *Attorney, Agent, or Firm* — William Park & Associates Patent Ltd.

(57) ABSTRACT

A semiconductor apparatus includes a test unit including: a data determination unit configured to receive a plurality of data, determine whether the plurality of data are identical or not, and output the determination result as a compression signal; and an output control unit configured to output the compression signal as a test result in response to a test mode signal and a die activation signal.

13 Claims, 3 Drawing Sheets

SEMICONDUCTOR APPARATUS, TEST METHOD USING THE SAME AND MUTI CHIPS SYSTEM

CROSS-REFERENCES TO RELATED APPLICATION

The present application claims priority under 35 U.S.C. §119(a) to Korean application number 10-2012-0149910, filed on Dec. 20, 2012, in the Korean Intellectual Property Office, which is incorporated herein by reference in its entirety.

BACKGROUND

1. Technical Field

Various embodiments relate to a semiconductor integrated circuit, and more particularly, to a semiconductor apparatus and a test method using the same.

2. Related Art

A general semiconductor apparatus, for example, a semiconductor memory apparatus is configured to store data and output the stored data. In order to increase a data storage capacity of a semiconductor apparatus, a semiconductor apparatus in which memory dies for storing data are stacked has been used.

Referring to FIG. 1, a conventional semiconductor apparatus includes first to third memory dies 10 to 30 which are sequentially stacked.

The stacked first to third memory dies 10 to 30 are coupled to each other through through-silicon vias (TSVs). For example, the conventional semiconductor apparatus may include a plurality of data input/output TSVs DQ_TSV1, DQ_TSV2, and DQ_TSV3 as shown in FIG. 1.

The semiconductor apparatus configured in such a manner is commercialized and launched on the market, depending on a result obtained by testing whether or not the respective memory dies 10 to 30 normally store and output data.

A method for testing whether or not the respective memory dies 10 to 30 normally store and output data is performed as follows. First, the same data are stored in the respective memory dies 10 to 30, one of the first to third memory dies 10 to 30 is selected, and the data stored in the selected memory die is outputted. Then, another memory die is selected, and the data stored in the selected memory die is outputted.

For example, high-level data are stored in the first to third memory dies 10 to 30. Then, the first memory die 10 among the first to third memory dies 10 to 30 is selected, and the data stored in the first memory die 10 are outputted through the first to third data input/output TSV DQ_TSV1, DQ_TSV2, and DQ_TSV3. Then, whether all of the data outputted from the first memory die 10 are at a high level or not is checked. After the test for the first memory die 10 is ended, the second memory die 20 is selected. The data stored in the second memory die 20 are outputted through the first to third data input/output TSV DQ_TSV1, DQ_TSV2, and DQ_TSV3. Then, whether all of the data outputted from the second memory die 20 are at a high level or not is checked. After the test for the second memory die 20 is ended, the third memory die 30 is selected. The data stored in the third memory die 30 are outputted through the first to third data input/output TSV DQ_TSV1, DQ_TSV2, and DQ_TSV3. Then, whether all of the data outputted from the third memory die 30 are at a high level or not is checked.

In the conventional semiconductor apparatus, the respective memory dies stacked therein are tested as the above. Therefore, the number of tests to be performed is decided according to the number of memory dies stacked in the semiconductor apparatus. Accordingly, when the test number of the semiconductor apparatus increases, the productivity of the semiconductor apparatus decreases.

SUMMARY

In one embodiment of the present invention, a semiconductor apparatus includes a test unit including: a data determination unit configured to receive a plurality of data, determine whether the plurality of data are identical or not, and output the determination result as a compression signal; and an output control unit configured to output the compression signal as a test result in response to a test mode signal and a die activation signal.

In an embodiment of the present invention, a semiconductor apparatus includes: a first memory die configured to be enabled in response to a first memory die activation code; a second memory die configured to be enabled in response to a second memory die activation code; a first TSV configured to couple the first and second memory dies; and a second TSV configured to couple the first and second memory dies, wherein the first memory die includes first and second test units, activates one of the first and second test units in response to the first memory die activation code, and outputs a test result of the first memory die through the second TSV, and the second memory die includes third and fourth test units, activates one of the third and fourth test units in response to the second memory die activation code, and outputs a test result of the second memory die through the second TSV.

In an embodiment of the present invention, a test method of a semiconductor apparatus includes the steps of: storing the same data in first and second memory dies during a test; inputting a first memory die activation code to the first memory die and inputting a second memory die activation code to the second memory die so as to activate both of the first and second memory dies; activating one of a plurality of test units included in the first memory die in response to the first memory die activation code; activating one of a plurality of test units included in the second memory die in response to the second memory die activation code; determining whether all of data outputted from the first memory die are identical or not, through an activated test unit included in the first memory die, and outputting the determination result through a first data input/output TSV; and determining whether all of data outputted from the second memory die are identical or not, through an activated test unit included in the second memory die, and outputting the determination result through a second data input/output TSV.

In an embodiment of the present invention A multi chips system, comprises a plurality of chips configured to be stacked; a plurality of TSV configured to form to penetrate the plurality of chips; and a plurality of test units configured to form in every chip, and couple the plurality of TSV, respectively, wherein one of the plurality of test units which is formed in the same chip is configured to select in every chip, to generate a test result, and the test result is outputted through a selected TSV coupled to the selected test unit.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a test method using the same according to the present invention will be described below with reference to the accompanying drawings through exemplary embodiments.

Figure 1:
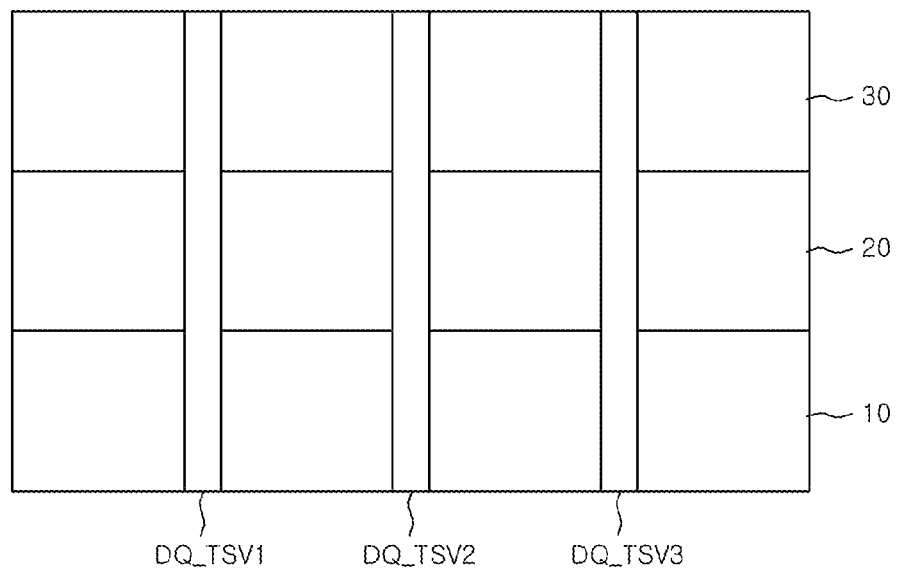
FIG. 1 is a cross section view of a conventional semiconductor apparatus.
Figure 2:
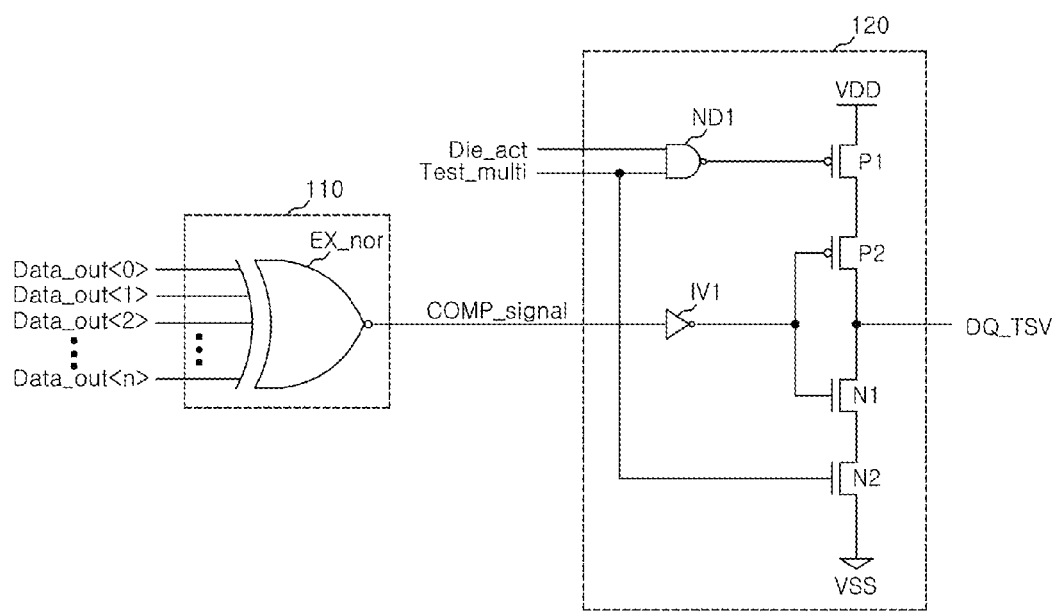
FIG. 2 is a circuit diagram of a test unit according to one embodiment of the present invention.

Referring to FIG. 2, a test unit 100 provided in a semiconductor apparatus according to an embodiment of the present invention may include a data determination unit 110 and an output control unit 120.

The data determination unit 110 may be configured to receive a plurality of data Data_out<0:n>, determine whether all of the data Data_out<0:n> are identical or not, and output the determination result as a compression signal COMP_signal. For example, the data determination unit 110 may include an exclusive NOR (XNOR) gate EX_nor. The XNOR gate EX_nor may be configured to receive the plurality of data Data_out<0:n> and output the compression signal COMP_signal. The data determination unit 110 may enable the compression signal COMP_signal when all of the plurality of data Data_out<0:n> are identical, and disable the compression signal COMP_signal when the plurality of data Data_out<0:n> are not identical.

The output control unit 120 may be configured to output the compression signal COMP_signal as a test result in response to a test mode signal Test_multi and a die activation signal Die_act. For example, the output control unit 120 may be configured to output the compression signal COMP_signal to a data input/output TSV DQ_TSV corresponding to an output terminal of the output control unit 120 when both of the test mode signal Test_multi and the die activation signal Die_act are enabled. That is, the data input/output TSV DQ_TSV may be coupled to the output control unit 120.

Accordingly, when both of the test mode signal Test_multi and the die activation signal Die_act are enabled, the test unit 100 may output a result on whether all of the data Data_out<0:n> are identical or not.

For example, the output control unit 120 may be configured to include a NAND gate ND1, an inverter IV1, and first to forth transistors P1, P2, N1, N2. The NAND gate ND1 may receive the test mode signal Test_multi and the die activation signal Die_act. The inverter IV1 may receive the compression signal COMP_signal. The first transistor P1 may have a source to which an external voltage VDD is inputted and a gate to which an output of the NAND gate ND1. The second transistor P2 may have a gate to which an output of the inverter IV1 and a source to which a drain of the first transistor P1 is coupled. The third transistor N1 may have a gate to which the output of the inverter IV1, and a drain to which a drain of the second transistor P2 is coupled. The forth transistor N2 may have a gate to which the test mode signal Test_multi is inputted, a drain to which a source of the third transistor N1 is coupled and a source to which a ground terminal is coupled. The output terminal may be coupled to a node which couples the second transistor P2 and the third transistor N1. Thus, the data input/output TSV DQ_TSV may be generated at the node.

Figure 3:
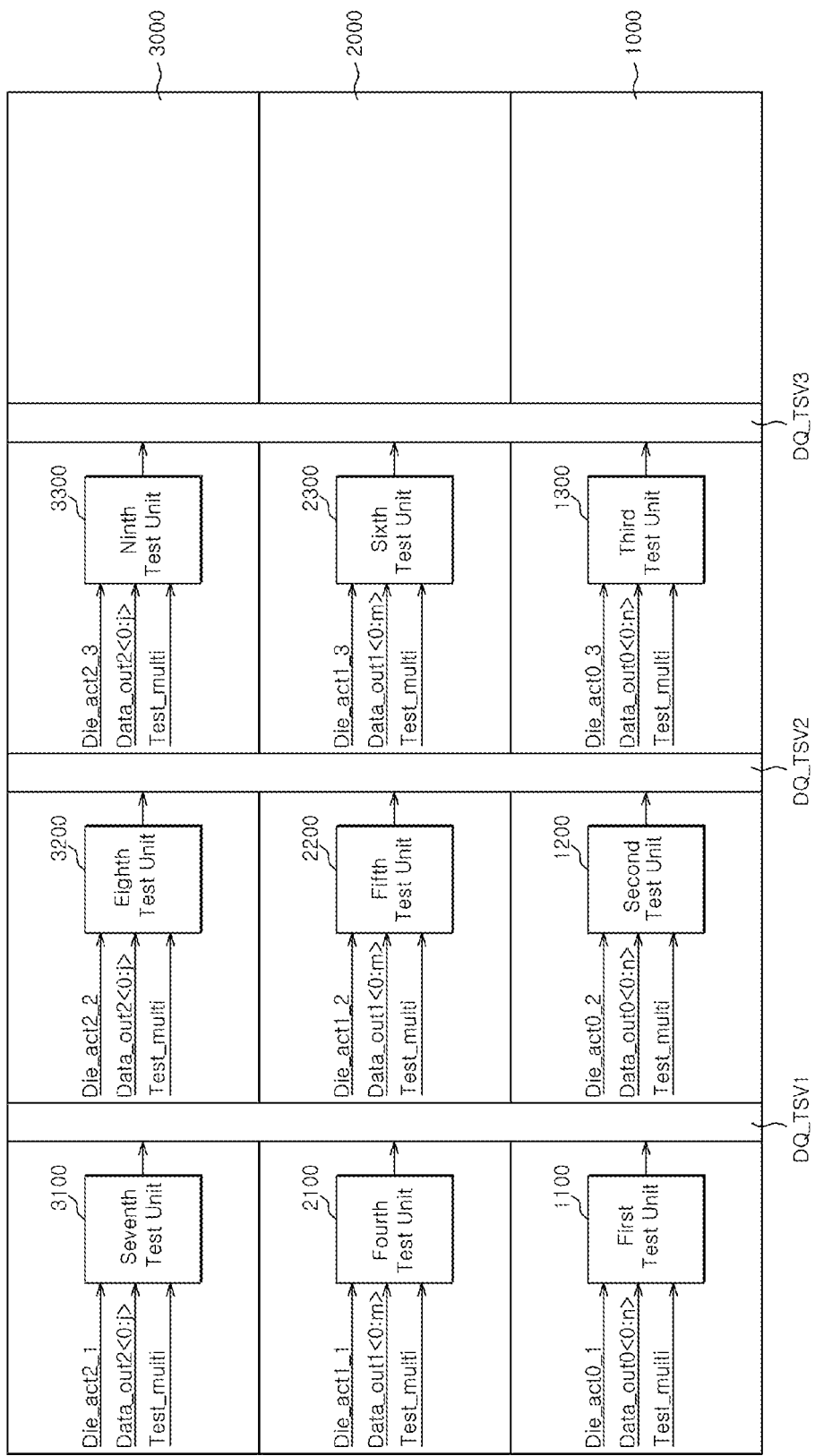
FIG. 3 is a block diagram of a semiconductor apparatus including the test unit according to the embodiment of the present invention.

Referring to FIG. 3, the test units may be included in a plurality of memory dies 1000, 2000, and 3000, respectively. Further, the plurality of memory dies 1000-3000 may be stacked. The first memory die 1000 may include a plurality of test unit, for example, first to third test units 1100 to 1300. The first memory die 1000 may be activated in response to a first memory die activation code Die_act0_1, Die_act0_2, and Die_acti0_3. The first memory die activation code Die_act0_1, Die_act0_2, and Die_act0_3 may include a first die activation signal Die_act0_1, a second die activation signal Die_act0_2, and a third die activation signal Die_acti0_3. For example, the first memory die activation code Die_act0_1 may be expressed to (Die_act0_1, Die_act0_2, Die_act0_3).

The first test unit 1100 may be configured to determine whether all of a plurality of first data Data_out0<0:n> are identical or not, in response to the first die activation signal Die_act0_1 and the test mode signal Test_multi, and output the determination result to the first data input/output TSV DQ_TSV1. For example, the first test unit 1100 may determine whether all of the first data Data_out0<0:n> are identical or not, and output the determination result to a first data input/output TSV DQ_TSV1 when both of the first die activation signal Die_act0_1 and the test mode signal Test_multi are enabled.

The second test unit 1200 may be configured to determine whether all of the first data Data_out0<0:n> are identical or not, in response to the second die activation signal Die_act0_2 and the test mode signal Test_multi, and output the determination result to the second data input/output TSV DQ_TSV2. For example, the second test unit 1200 may determine whether all of the first data Data_out0<0:n> are identical or not, and output the determination result to the second data input/output TSV DQ_TSV2 when both of the second die activation signal Die_act0_2 and the test mode signal Test_multi are enabled.

The third test unit 1300 may be configured to determine whether all of the first data Data_out0<0:n> are identical or not, in response to the third die activation signal Die_act0_3 and the test mode signal Test_multi, and output the determination result to the third data input/output TSV DQ_TSV3. For example, the third test unit 1300 may determine whether all of the first data Data_out0<0:n> are identical or not, and output the determination result to the third data input/output TSV DQ_TSV3 when both of the third die activation signal Die_act0_3 and the test mode signal Test_multi are enabled.

The second memory die 2000 may include fourth to sixth test units 2100 to 2300. The second memory die 2000 may be activated in response to a second memory die activation code Die_act1_1, Die_act1_2, and Die_acti1_3. The second memory die activation code Die_act1_1, Die_act1_2, and Die_acti1_3 may include a fourth die activation signal Die_act1_1, a fifth die activation signal Die_act1_2, and a sixth die activation signal Die_acti1_3.

The fourth test unit 2100 may be configured to determine whether all of a plurality of second data Data_out1<0:m> are identical or not, in response to the fourth die activation signal Die_act1_1 and the test mode signal Test_multi, and output the determination result to the first data input/output TSV DQ_TSV1. For example, the fourth test unit 2100 may determine whether all of the second data Data_out1<0:m> are identical or not, and output the determination result to the first data input/output TSV DQ_TSV1 when both of the fourth die activation signal Die_act1_1 and the test mode signal Test_multi are enabled.

The fifth test unit 2200 may be configured to determine whether all of the second data Data_out1<0:m> are identical or not, in response to the fifth die activation signal Die_act1_2 and the test mode signal Test_multi, and output the determination result to the second data input/output TSV DQ_TSV2. For example, the second test unit 2200 may determine whether all of the second data Data_out1<0:m> are identical or not, and outputs the determination result to the second data input/output TSV DQ_TSV2 when both of the fifth die activation signal Die_act1_2 and the test mode signal Test_multi are enabled.

The sixth test unit 2300 may be configured to determine whether all of the second data Data_out1<0:m> are identical or not, in response to the sixth die activation signal Die_act1_3 and the test mode signal Test_multi, and output the determination result to the third data input/output TSV DQ_TSV3. For example, the sixth test unit 2300 may determine whether all of the second data Data_out1<0:m> are identical or not, and output the determination result to the third data input/output TSV DQ_TSV3 when both of the sixth die activation signal Die_act1_3 and the test mode signal Test_multi are enabled.

The third memory die 3000 may include seventh to ninth test units 3100 to 3300. The third memory die 3000 may be activated in response to a third memory die activation code Die_act2_1, Die_act2_2, and Die_acti2_3. The third memory die activation code Die_act2_1, Die_act2_2, and Die_acti2_3 include a seventh die activation signal Die_act2_1, an eighth die activation signal Die_act2_2, and a ninth die activation signal Die_acti2_3.

The seventh test unit 3100 may be configured to determine whether all of a plurality of third data Data_out2<0:j> are identical or not, in response to the seventh die activation signal Die_act2_1 and the test mode signal Test_multi, and output the determination result to the first data input/output TSV DQ_TSV1. For example, the seventh test unit 3100 may determine whether all of the third data Data_out2<0:j> are identical or not, and output the determination result to the first data input/output TSV DQ_TSV1 when both of the seventh die activation signal Die_act2_1 and the test mode signal Test_multi are enabled.

The eighth test unit 3200 may be configured to determine whether all of the third data Data_out1<0:j> are identical or not, in response to the eighth die activation signal Die_act2_2 and the test mode signal Test_multi, and output the determination result to the second data input/output TSV DQ_TSV2. For example, the eighth test unit 3200 determine whether all of the third data Data_out1<0:j> are identical or not, and output the determination result to the second data input/output TSV DQ_TSV2 when both of the eighth die activation signal Die_act2_2 and the test mode signal Test_multi are enabled.

The ninth test unit 3300 may be configured to determine whether all of the third data Data_out2<0:j> are identical or not, in response to the ninth die activation signal Die_act3_3 and the test mode signal Test_multi, and output the determination result to the third data input/output TSV DQ_TSV3. For example, the ninth test unit 3300 may determine whether all of the third data Data_out2<0:j> are identical or not, and output the determination result to the third data input/output TSV DQ_TSV3 when both of the ninth die activation signal Die_act2_3 and the test mode signal Test_multi are enabled.

The semiconductor apparatus according to the embodiment of the present invention is operated as follows. At this time, a semiconductor apparatus in which three memory dies, that is, the first to third memory dies 1000 to 3000 are stacked will be taken as an example for description.

During a test operation, that is, when the test mode signal Test_multi is enabled, data at a specific level are stored in the first to third memory dies 1000 to 3000, and the stored data are outputted through the input/output TSV DQ_TSV1-DQ_TSV3. When the data stored in the first memory die 1000 are outputted, the data outputted from the first memory die 1000 may be the plurality of first data Data_out0<0:n>. Furthermore, when the data stored in the second memory die 2000 are outputted, the data outputted from the second memory die 2000 may be the plurality of second data Data_out1<0:m>. When the data stored in the third memory die 3000 are outputted, the data outputted from the third memory die 3000 may be the plurality of third data Data_out2<0:j>.

The first to third memory dies 1000 to 3000 may be activated to output the data stored in the respective memory dies 1000 to 3000. The first memory die activation code Die_act0_1, Die_act0_2, and Die_act0_3 for activating the first memory die 1000 may be provided to the first memory die 1000, the second memory die activation code Die_act1_1, Die_act1_2, and Die_act1_3 for activating the second memory die 2000 may be provided the second memory die 2000, and the third memory die activation code Die_act2_1, Die_act2_2, and Die_act2_3 for activating the third memory die 3000 may be provided to the third memory die 3000. For example, the first memory die activation code Die_act0_1, Die_act0_2, and Die_act0_3 for activating the first memory die 1000 may correspond to (1, 0, 0), the second memory die activation code Die_act1_1, Die_act1_2, and Die_act1_3 for activating the second memory die 2000 may correspond to (0, 1, 0), and the third memory die activation code Die_act2_1, Die_act2_2, and Die_act2_3 for activating the third memory die 3000 may correspond to (0, 0, 1). That is, among the first to third die activation signals Die_act0_1, Die_act0_2, and Die_act0_3 included in the first memory die activation code Die_act0_1, Die_act0_2, and Die_act0_3, only the first die activation signal Die_act0_1 may be enabled, and the other die activation signals Die_act0_2 and Die_act0_3 may be disabled. Among the fourth to sixth die activation signals Die_act1_1, Die_act1_2, and Die_act1_3 included in the second memory die activation code Die_act1_1, Die_act1_2, and Die_act1_3, only the fifth die activation signal Die_act1_2 may enabled, and the other die activation signals Die_act1_1 and Die_act1_3 may be disabled. Among the seventh to ninth die activation signals Die_act2_1, Die_act2_2, and Die_act2_3 included in the third memory die activation code Die_act2_1, Die_act2_2, and Die_act2_3, only the ninth die activation signal Die_act2_3 may be enabled, and the other die activation signals Die_act2_1 and Die_act2_2 may be disabled. Thus, one among the test unit 1100-3300 may be enabled per one memory die 1000-3000.

That is, the first memory die 1000 may include the first to third test units 1100 to 1300. At this time, the first test unit 1100 may receive the first die activation signal Die_act0_1 and the test mode signal Test_multi. The second test unit 1200 may receive the second die activation signal Die_act0_2 and the test mode signal Test_multi. The third test unit 1300 may receive the third die activation signal Die_act0_3 and the test mode signal Test_multi. Therefore, the first test unit 1100 among the first to third test units 1000-3000 may output a test result on whether all of the first data Data_out0<0:n> outputted from the first memory die 1000 are identical or not, through the first data input/output TSV DQ_TSV1.

The second memory die 2000 may include the fourth to sixth test units 2100 to 2300. The fourth test unit 2100 may receive the fourth die activation signal Die_act1_1 and the test mode signal Test_multi. The fifth test unit 2200 may receive the fifth die activation signal Die_act1_2 and the test mode signal Test_multi. The sixth test unit 2300 may receive the sixth die activation signal Die_act1_3 and the test mode signal Test_multi. Therefore, the fifth test unit 2200 among the fourth to sixth test units 2100 to 2300 may output a test result on whether all of the second data Data_out1<0:m> outputted from the second memory die 2000 are identical or not, through the second data input/output TSV DQ_TSV2.

The third memory die 3000 may include the seventh to ninth test units 3100-3300. The seventh test unit 3100 may receive the seventh die activation signal Die_act2_1 and the test mode signal Test_multi. The eighth test unit 3200 may receive the eighth die activation signal Die_act2_2 and the test mode signal Test_multi. The ninth test unit 3300 may receive the ninth die activation signal Die_act2_3 and the test mode signal Test_multi. Therefore, the ninth test unit 3300 among the seventh to ninth test units 3100-3300 may output a test result on whether all of the third data Data_out2<0:j> outputted from the first memory die 3000 are identical or not, through the third data input/output TSV DQ_TSV3.

The semiconductor apparatus according to the embodiment of the present invention may output test results of different memory dies to TSVs which couple a plurality of memory dies, when the plurality of memory dies are stacked. Therefore, even when the plurality of memory dies are stacked, the semiconductor apparatus according to the embodiment of the present invention may determine whether or not the plurality of memory dies have a defect, through one test. Therefore, the test time of the semiconductor apparatus may be reduced. Accordingly, when the test time for the semiconductor apparatus is reduced, the production cost of the semiconductor apparatus may be reduced to thereby increase the productivity of the semiconductor apparatus.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus with a test unit comprising:
   wherein the test unit comprises:
   a data determination unit configured to receive a plurality of data, determine whether the plurality of data are identical or not, and output the determination result as a compression signal; and
   an output control unit configured to output the compression signal as a test result in response to a test mode signal and a die activation signal.

2. The semiconductor apparatus according to claim 1, wherein the data determination unit is configured to enable the compression signal when all of the data are equal to one another, and disable the compression signal when any one of the data has a different value.

3. The semiconductor apparatus according to claim 1, wherein the output control unit is configured to output the compression signal as the test result when both of the test mode signal and the die activation signal are enabled, and block the compression signal from being outputted as the test result when any one of the test mode signal and the die activation signal is disabled.

4. A semiconductor apparatus, comprising:
   a memory die comprising a plurality of test units and a plurality of through-silicon vias (TSVs) coupled to the respective test units,
   wherein the memory die is activated in response to a memory die activation code, and one of the test units outputs a test result in response to a test mode signal and the memory die activation code, through a TSV coupled to the test unit.

5. The semiconductor apparatus according to claim 4, wherein the memory die activation code comprises first and second die activation signals, the plurality of test units comprise first and second test units, and the plurality of TSVs comprise first and second TSVs,
   the first test unit outputs the test result to the first TSV when both of the first die activation signal and the test mode signal are enabled, and
   the second test unit outputs the test result to the second TSV when both of the second die activation signal and the test mode signal are enabled.

6. The semiconductor apparatus according to claim 5, wherein the first test unit comprises:
   a data determination unit configured to determine whether all of a plurality of first data outputted from the memory die are identical or not and generate a first compression signal; and
   an output control unit configured to output the first compression signal through the first TSV when both of the first die activation signal and the test mode signal are enabled.

7. The semiconductor apparatus according to claim 5, wherein the second test unit comprises:
   a data determination unit configured to determine whether all of a plurality of first data are identical or not and generate a second compression signal; and
   an output control unit configured to output the second compression signal through the second TSV when both of the second die activation signal and the test mode signal are enabled.

8. A semiconductor apparatus comprising:
   a first memory die configured to be enabled in response to a first memory die activation code;
   a second memory die configured to be enabled in response to a second memory die activation code, and disposed on the first memory die;
   a first TSV configured to couple the first and second memory dies; and
   a second TSV configured to couple the first and second memory dies,
   wherein the first memory die comprises first and second test units, activates one of the first and second test units in response to the first memory die activation code, and outputs a test result of the first memory die through the first TSV, and
   the second memory die comprises third and fourth test units, activates one of the third and fourth test units in response to the second memory die activation code, and outputs a test result of the second memory die through the second TSV.

9. The semiconductor apparatus according to claim 8, wherein the first memory die activation code comprises first and second die activation signals,
   the first test unit is configured to determine whether all of a plurality of first data outputted from the first memory die are identical or not, generate the determination result as a first compression signal, and output the first compression signal through the first TSV when both of the first die activation signal and a test mode signal are enabled, and
   the second test unit is configured to determine whether all of the plurality of first data outputted from the first memory die are identical or not, generate the determination result as a second compression signal, and output the second compression signal through the second TSV when both of the second die activation signal and the test mode signal are enabled.

10. The semiconductor apparatus according to claim 9, wherein the second memory die activation code comprises third and fourth die activation signals, the third test unit is configured to determine whether all of a plurality of second data outputted from the second memory die are identical or not, generate the determination result as a third compression signal, and output the third compression signal through the first TSV when both of the third die activation signal and the test mode signal are enabled, and the fourth test unit is configured to determine whether all of the plurality of second data outputted from the second memory die are identical or not, generate the determination result as a fourth compression signal, and output the fourth compression signal through the second TSV when both of the fourth die activation signal and the test mode signal are enabled.

11. The semiconductor apparatus according to claim 10, wherein the first and second memory die activation codes have different code values, one of the first and second die activation signals included in the first memory die activation code is enabled, and one of the third and fourth die activation signals included in the second memory die activation code is enabled.

12. A test method of a semiconductor apparatus, comprising the steps of:

storing a same data in first and second memory dies during a test;

providing a first memory die activation code to the first memory die and providing a second memory die activation code to the second memory die so as to activate both of the first and second memory dies;

activating one of a plurality of test units included in the first memory die in response to the first memory die activation code;

activating one of a plurality of test units included in the second memory die in response to the second memory die activation code;

determining whether all of data outputted from the first memory die are identical or not, through an activated test unit included in the first memory die, and outputting the determination result through a first data input/output TSV; and determining whether all of data outputted from the second memory die are identical or not, through an activated test unit included in the second memory die, and outputting the determination result through a second data input/output TSV.

13. The test method according to claim 12, wherein the first and second data input/output TSVs couple the first and second memory dies.

* * * * *